United States Patent
Park (10) Patent No.: US 8,934,303 B2
(45) Date of Patent: Jan. 13, 2015

(54) SEMICONDUCTOR MEMORY DEVICE AND METHOD OF OPERATING THE SAME

(75) Inventor: Young Soo Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 275 days.

(21) Appl. No.: 13/534,540

(22) Filed: Jun. 27, 2012

(65) Prior Publication Data

US 2013/0003453 A1    Jan. 3, 2013

(30) Foreign Application Priority Data

Jun. 28, 2011    (KR) .................. 10-2011-0062844

(51) Int. Cl.
*G11C 16/10*    (2006.01)
*G11C 16/04*    (2006.01)
*G11C 16/24*    (2006.01)

(52) U.S. Cl.
CPC ............ *G11C 16/0483* (2013.01); *G11C 16/10* (2013.01); *G11C 16/24* (2013.01)
USPC ................................ 365/185.2; 365/185.25

(58) Field of Classification Search
None
See application file for complete search history.

(56) References Cited

U.S. PATENT DOCUMENTS

| | | | |
|---|---|---|---|
| 6,031,760 A * | 2/2000 | Sakui et al. | 365/185.21 |
| 2008/0049502 A1* | 2/2008 | Byeon et al. | 365/185.05 |
| 2009/0097325 A1* | 4/2009 | Won et al. | 365/185.22 |

FOREIGN PATENT DOCUMENTS

| | | |
|---|---|---|
| KR | 1020100131709 A | 12/2010 |
| KR | 101044466 B1 | 6/2011 |

* cited by examiner

*Primary Examiner* — James G Norman
(74) *Attorney, Agent, or Firm* — William Park & Associates Patent Ltd.

(57) ABSTRACT

A semiconductor memory device is operated by, inter alia: precharging a bit line, providing a first voltage to a coupling circuit for coupling the bit lines and cell strings of a plurality of memory cells, providing a program voltage to a selected word line coupled to a memory cell on which a program operation will be performed among the plurality of memory cells, providing a pass voltage to unselected word lines, providing a second voltage lower than the first voltage to the coupling circuit, discharging the bit line by loading program data, and providing a third voltage lower than the second voltage to the coupling circuit.

19 Claims, 6 Drawing Sheets

SEMICONDUCTOR MEMORY DEVICE AND METHOD OF OPERATING THE SAME

CROSS-REFERENCE TO RELATED APPLICATION

Priority to Korean patent application number 10-2011-0062844 filed on Jun. 28, 2011, the entire disclosure of which is incorporated by reference herein, is claimed.

BACKGROUND

1. Field of Invention

Embodiments of this disclosure relate generally to a semiconductor memory device and a method of operating the same and, more particularly, to a semiconductor memory device and a method of operating the same, which are capable of performing a soft program operation.

2. Related Art

In non-volatile memory devices, such as NAND flash memory among other semiconductor memory devices, a program operation on memory cells is performed using an FN tunneling method. The FN tunneling method is performed by providing a voltage of 15 V or higher to control gates while the cell channel of the memory cells is set to 0 V, thereby allowing electrons to move from the cell channel to floating gates. In this FN tunneling method, the influence of an electric field applied to the memory cells is significant since a voltage of 15 V or higher must be set in the control gates for a limited time while the cell channel is set to 0 V. This causes instability issues in memory cells, thus adversely affecting operation.

BRIEF SUMMARY

In accordance with an exemplary embodiment of this disclosure, a soft program operation may be performed by controlling the FN tunneling speed in such a manner that the cell channel of all memory cells is self-boosted and the time taken for the cell channel of memory cells, into which data '0' will be programmed, to discharge is then controlled.

A method of operating the semiconductor memory device according to an aspect of the present disclosure includes precharging a bit line, providing a first voltage to a coupling circuit for coupling the bit lines and cell strings of a plurality of memory cells, providing a program voltage to a selected word line coupled to a memory cell on which a program operation will be performed among the plurality of memory cells, providing a pass voltage to remaining unselected word lines, providing a second voltage lower than the first voltage to the coupling circuit, discharging the bit line by loading program data, and providing a third voltage lower than the second voltage to the coupling circuit.

A semiconductor memory device according to another aspect of the present disclosure includes cell strings each configured to include a plurality of memory cells, a first coupling circuit for coupling the memory cells and a bit line, page buffers each configured to include latch circuits for latching data, a second coupling circuit for coupling the latch circuits and the bit line, a voltage supply circuit configured to supply first to third voltages to the first coupling circuit in response to first to third control signals, respectively, in a program operation, and a controller configured to generate the first to third control signals and to supply voltage lower than a reference voltage to the second coupling circuit when the bit line is discharged by loading program data stored in the latch circuits during the program operation.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 1:
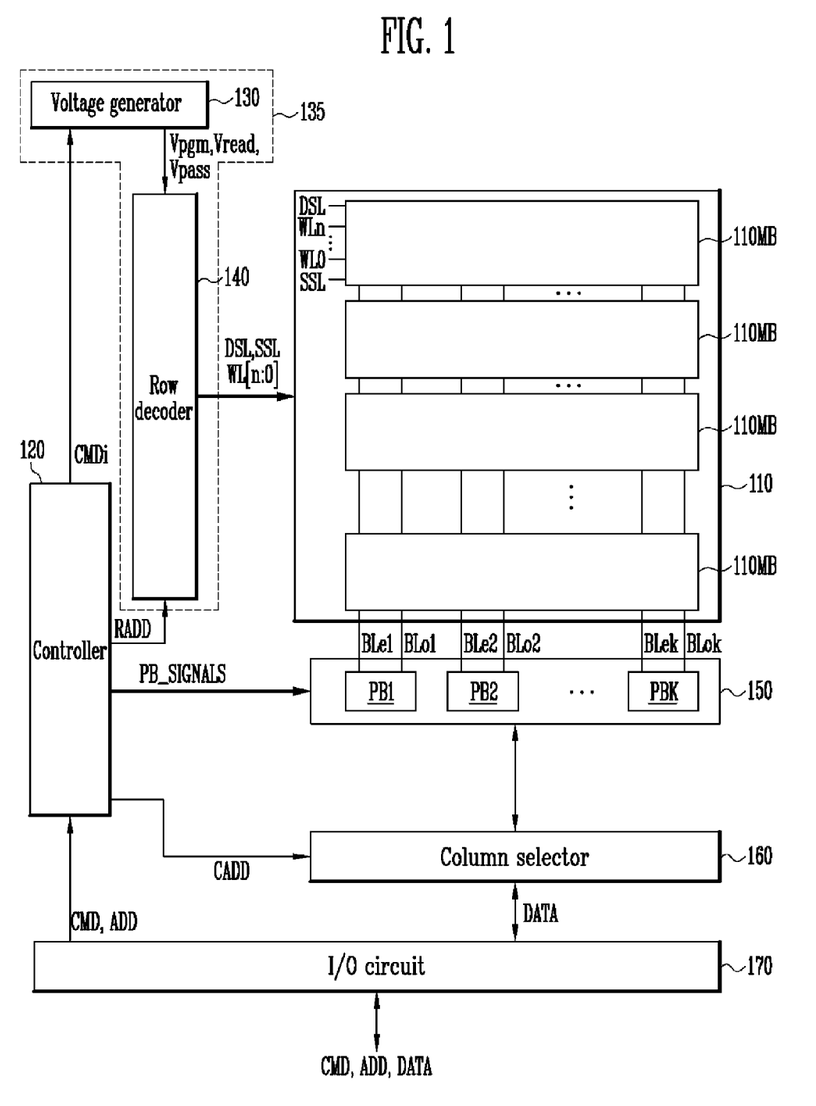
FIG. 1 is a block diagram of a semiconductor memory device according to an exemplary embodiment of this disclosure.

FIG. 1 is a block diagram of a semiconductor memory device according to an embodiment of this disclosure.

The semiconductor memory device according to the exemplary embodiment of this disclosure includes a memory array 110 configured to include a plurality of memory blocks 110MB, operation circuits (130, 140, 150, 160, and 170) collectively configured to perform a program operation, a read operation, and a test operation on the memory cells of each page selected within the memory cell block 110MB, and a controller 120 configured to control the operation circuits (130, 140, 150, 160, and 170). Specifically for a NAND flash memory device, the operation circuit includes a voltage supply circuit 135, a page buffer group 150, a column selector 160, an I/O circuit 170.

The memory array 110 includes the plurality of memory blocks 110MB. An individual memory block 110 MB is described in FIG. 2.

Figure 2:
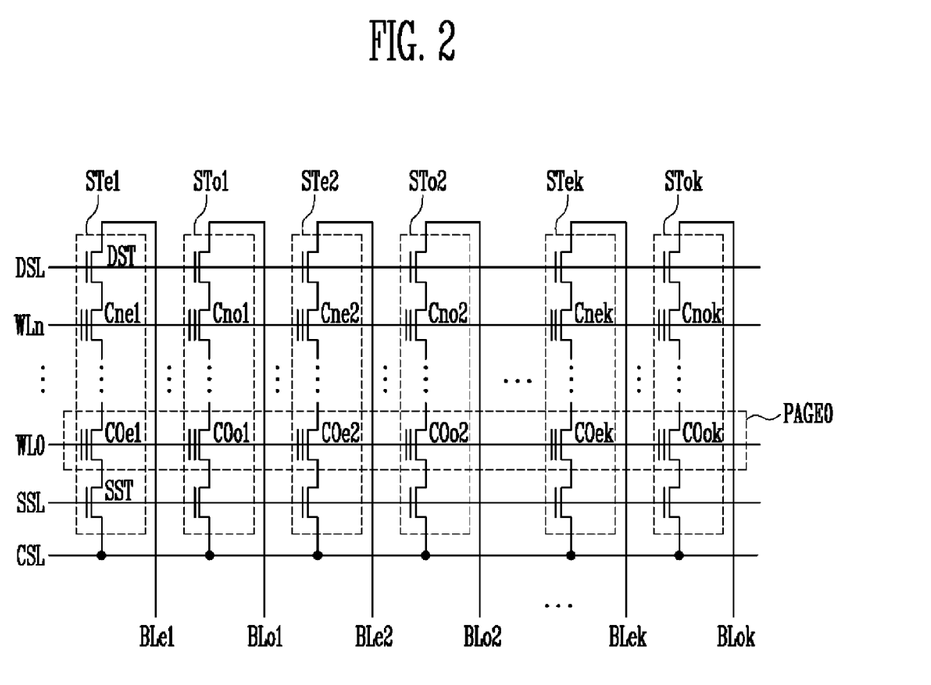
FIG. 2 is a circuit diagram of a memory block shown in FIG. 1.

Referring to FIG. 2, each memory block includes a plurality of strings STe1 to STek and STo1 to STok coupled between respective bit lines BLe1 to BLek and BLo1 to BLok, and a common source line CSL. That is, the strings STe1 to STok are coupled to the respective bit lines BLe1 to BLok and are coupled to the common source line CSL. Each string, e.g. STe1, includes a source select transistor SST having a source coupled to the common source line CSL, a plurality of memory cells, e.g. C0$e$1 to Cn$e$1, and a drain select transistor DST having a drain coupled to a bit line, e.g. BLe1. The memory cells, e.g. C0$e$1 to Cn$e$1, are coupled in series between the select transistors SST and DST. The gate of the source select transistor SST is commonly coupled to a source select line SSL, the gates of the memory cells, e.g. C0$e$1 to Cn$e$1, are commonly coupled to respective word lines WL0 to WLn, and the gate of the drain select transistor DST is commonly coupled to a drain select line DSL.

In a NAND flash memory device, memory cells included in a memory cell block may be divided into physical pages and logical pages. For example, the memory cells C0$e$1 to C0$ek$ and C0$o$1 to C0$ok$ coupled to a word line WL0 may form a physical page PAGE0. Furthermore, the even-numbered memory cells C0$e$1 to C0$ek$ coupled to the word line WL0 may form an even physical page, and the odd-numbered memory cells C0o1 to C0ok coupled to the word line WL0 may form an odd physical page. The page, both even and odd, is a basic unit for a program operation or a read operation.

Referring back to FIGS. 1 and 2, the controller 120 generates an internal command signal CMDi for performing a program operation, a read operation, or a test operation in response to an external command signal CMD received via the I/O circuit 170, and additionally generates PB control signals PB_SIGNALS to control the page buffers PB1 to PBk of the page buffer group 150 depending on the type of operation. An operation in which the controller 120 controls the page buffer group 150 is described in detail later, but at a higher level, controller 120 generates a row address signal RADD and a column address signal CADD in response to an external address signal ADD received via the I/O circuit 170.

In response to the internal command signal CMDi of the controller 120, the voltage supply circuit 135 supplies operating voltages, e.g. Vpgm, Vread, and Vpass, necessary for a program operation, a read operation, and a test operation respectively, on the memory cells and local lines, which include the drain select line DSL, the word lines WL0 to WLn, and the source select line SSL of a selected memory cell block. The voltage supply circuit 135 includes a voltage generator 130 and a row decoder 140.

The voltage generator 130 outputs the operating voltages Vpgm, Vread, and Vpass, necessary for a program operation, a read operation, and a test operation, respectively, on memory cells onto global lines in response to the internal command signal CMDi of the controller 120. For example, for the program operation, the voltage generator 130 may output onto the global lines the program voltage Vpgm to be supplied to the memory cells of a selected page and the pass voltage Vpass to be supplied to the remaining unselected memory cells of the selected page via the row decoder 140. Similarly for the read operation, the voltage generator 130 may output onto the global lines the read voltage Vread to be supplied to the memory cells of a selected page and the pass voltage Vpass to be supplied to the remaining unselected memory cells of the selected page via the row decoder 140. The voltage generator 130 may output the program voltage Vpgm and the pass voltage Vpass in a concurrent program and test operation for the storage of data and may output the read voltage Vread and the pass voltage Vpass in a concurrent read and test operation for the read of data.

The row decoder 140 couples the global lines and the local lines DSL, WL0 to WLn, and SSL in response to the row address signals RADD of the controller 120 such that the operating voltages transferred from the voltage generator 130 onto the global lines are then transferred to the local lines DSL, WL0 to WLn, and SSL in order to become inputs for selected memory blocks within memory array 110. Thus, the program voltage Vpgm or the read voltage Vread is supplied from the voltage generator 130 to a local word line, e.g. WL0, coupled to a selected cell, e.g. C0e1, via a relevant global word line. In addition, the pass voltage Vpass is supplied from the voltage generator 130 to local word lines, e.g. WL1 to WLn, coupled to remaining unselected cells, e.g. C1e1 to Cne1, via relevant global word lines. In an erase operation, an erase voltage Vera may be supplied to all the memory cells of the selected memory block 110MB. Data may be stored into the selected cell C0e1 by the program voltage Vpgm or data stored in the selected cell C0e1 may be read out by the read voltage Vread.

The page buffer group 150 includes a plurality of page buffers PB1 to PBk coupled to the memory array 110 via the bit lines BLe1 to BLek and BLo1 to BLok. The page buffers PB1 to PBk of the page buffer group 150 selectively precharge the bit lines BLe1 to BLek or BLo1 to BLok according to received data in order to store the received data in the memory cells C0e1 to C0ek or C0o1 to C0ok. The page buffers may also sense voltages of the bit lines BLe1 to BLek or BLo1 to BLok in order to read data from the memory cells C0e1 to C0ek or C0o1 to C0ok in response to the PB control signal PB_SIGNALS of the controller 120.

For example, when program data, e.g. data '0', to be stored in the memory cell C0e1 is an input to the page buffer PB1, the page buffer PB1 supplies a program permission voltage, e.g. a ground voltage, to the bit line BLe1 coupled to the memory cell C0e1 in which the program data will be stored in a program operation. The threshold voltage of the memory cell C0e1 rises owing to the program voltage Vpgm supplied to the word line WL0 and the program permission voltage supplied to the bit line BLe1. In another example, when erase data, e.g. data '1', to be stored in the memory cell C0e1 is inputted to the page buffer PB1, the page buffer PB1 supplies a program inhibition voltage, e.g. a power source voltage, to the bit line BLe1 coupled to the memory cell C0e1 in which the erase data will be stored in a program operation. In contrast to the above example, although the program voltage Vpgm is supplied to the word line WL0 in the program operation, the threshold voltage of the memory cell C0e1 does not rise, owing to the program inhibition voltage supplied to the bit line BLe1. As the threshold voltage of the memory cell is varied as described above, undesirable data may be stored in the memory cell.

In a read operation, the page buffer group 150 precharges all selected bit lines, e.g. BLe1 to BLek, and discharges all remaining unselected bit lines, e.g. BLo1 to BLok. When the voltage supply circuit 135 supplies the read voltage Vread to a selected word line, e.g. WL0, bit lines coupled to memory cells in which program data is stored remain precharged, and bit lines coupled to memory cells in which erase data is stored are discharged. The page buffer group 150 senses a change in the voltages of the bit lines BLe1 to BLek and latches the data of the memory cells.

The construction of the page buffer will be described in detail in FIG. 3.

The column selector 160 selects the page buffers PB1 to PBk of the page buffer group 150 in response to the column address signal CADD from the controller 120. That is, the column selector 160 sequentially transfers data to be stored in memory cells to the page buffers PB1 to PBk in response to the column address signal CADD. For a read operation, the column selector 160 sequentially selects the page buffers PB1 to PBk in response to the column address signal CADD so that the data of memory cells latched in the page buffers PB1 to PBk act as an external output.

The I/O circuit 170 transfers external data DATA to the column selector 160 in response to controller 120 in a program operation so that the external data is an input to the page buffer group 150 in order to be stored in memory cells. There is an intermediate step, where the column selector 160 transfers the external data DATA to the page buffers PB1 to PBk of the page buffer group 150, which store the external data DATA in their internal latch circuits. In a read operation, the I/O circuit 170 externally outputs data DATA received from the page buffers PB1 to PBk of the page buffer group 150 via the column selector 160.

Figure 3:
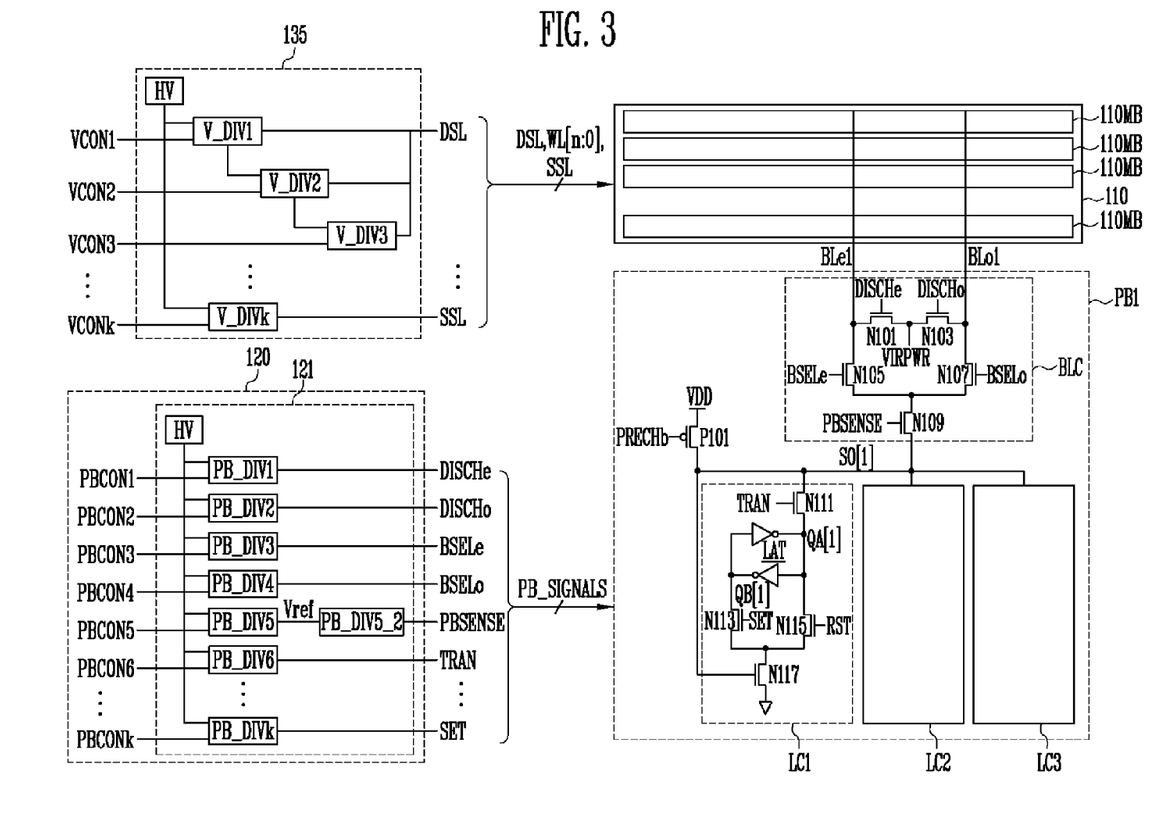
FIG. 3 is a detailed circuit diagram of a page buffer shown in FIG. 1.

FIG. 3 is a detailed circuit diagram of one of the page buffers PB1 to PBk shown in FIG. 1. The page buffers PB1 to PBk have similar construction, and thus only the page buffer PB1 is described.

Referring to FIG. 3, the input for the page buffer PB1 is provided by the page buffer controller 121 of the controller 120, particularly signals PRECHb, TRAN, RST, SET, PBSENSE, BSELe, BSELo, DISCHe, and DISCHo to be described below. It should be noted that RST and SET are described in latch circuit LC1 of FIG. 3.

The page buffer PB1 includes a bit line coupling circuit BLC, a precharge circuit P101, and first to third latch circuits LC1 to LC3.

The switching elements N105 and N107 of the bit line coupling circuit BLC select the even bit line BLe1 or the odd bit line BLo1 respectively in response to the bit line select signals BSELe or BSELo. The switching elements N101 and N103 of the bit line coupling circuit BLC perform an operation of precharging an unselected bit line in a program operation or of discharging an unselected bit line in a read operation, in response to the respective discharge signals DISCHe and DISCHo. The switching element N109 of the bit line coupling circuit BLC couples the bit line selected by either switching element N105 or N107 and the first to third latch circuits LC1 to LC3 in response to the second coupling signal PBSENSE. The first to third latch circuits LC1 to LC3 are coupled in parallel to the switching element N109 at a sense node SO.

The precharge circuit P101 precharges the sense node SO in response to the precharge signal PRECHb.

It should be noted that only three latch circuits LC1 to LC3 are illustrated as an example, but the number of latch circuits may vary according to the design. Only one of the first to third latch circuits LC1 to LC3 is typically enabled. For example, the first latch circuit LC1 may temporarily store data received from the column selector 160 and transfer the data to the second latch circuit LC2 or may temporarily store data received from a memory cell in a read operation in order to output the data to the column selector 160. The second latch circuit LC2 may supply the program inhibition voltage or the program permission voltage to a bit line in a program operation according to data received from the first latch circuit LC1. The second latch circuit LC2 may also temporarily store data read from a memory cell according to the voltage of a bit line in a read operation and transfer the stored data to the first latch circuit LC1. The third latch circuit LC3 may latch a value corresponding to the result of comparison between the threshold voltage of a memory cell and a target voltage in a verify operation subsequent to a program operation and may generate a value in the form of a signal.

Each of the first to third latch circuits LC1 to LC3 includes a plurality of switching elements and a latch. The first to third latch circuits LC1 to LC3 have a similar construction, and thus the first latch circuit LC1 is chiefly described below.

The first latch circuit LC1 includes a latch LAT configured to latch data, a switching element N111 configured to couple the first node QA of the latch LAT and the sense node SO in response to the transfer signal TRAN, switching elements N113 and N115 coupled to the non-inverting terminal QA and the inverting terminal QB of the latch LAT, respectively, a switching element N117 coupled between the switching elements N113 and N115 and a ground terminal in response to the potential of the sense node SO. Switching elements N113 and N115 operate in response to the set signal SET and the reset signal RST, respectively.

Since signals having different waveforms are input into the second and the third latch circuits LC2 and LC3, only one of the first to third latch circuits LC1 to LC3 is enabled at a time although they have the same configuration. The first to third latch circuits LC1 to LC3 may also perform different functions.

The controller 120 includes a plurality of circuits for controlling circuits included in the semiconductor memory device.

First, the controller 120 generates first to $k^{th}$ control signals VCON1 to VCONk to control the voltage supply circuit 135.

The voltage supply circuit 135 includes a first high voltage generator HV and first to $k^{th}$ voltage dividers V_DIV1 to V_DIVk. A high voltage generated from the first high voltage generator HV is transferred to the first to $k^{th}$ voltage dividers V_DIV1 to V_DIVk. In response to the first to $k^{th}$ control signals VCON1 to VCONk of the controller 120, the first to $k^{th}$ voltage dividers V_DIV1 to V_DIVk outputs the received high voltage to the drain select line DSL, the word lines WL0 to WLn, and the source select line SSL.

For example, the first voltage divider V_DIV1 may output the high voltage of the first high voltage generator HV as a first drain select voltage DSL1 to be supplied to the drain select line DSL in response to the first control signal VCON1. The second voltage divider V_DIV2 may divide the first drain select voltage DSL1 and output a divided voltage as a second drain select voltage DSL2 to be supplied to the drain select line DSL in response to the second control signal VCON2. Similarly, the third voltage divider V_DIV3 may divide the second drain select voltage DSL2 and supply a divided voltage as a third drain select voltage DSL3 to be supplied to the drain select line DSL in response to the third control signal VCON3.

When a bit line is precharged in a program operation, the controller 120 may output the first control signal VCON1. If the program voltage Vpgm is supplied to a selected word line coupled to a memory cell on which a program operation will be performed, and the pass voltage Vpass is supplied to the remaining unselected word lines, the controller 120 may output the second control signal VCON2. If a bit line is discharged, the controller 120 may output the third control signal VCON3.

The page buffer controller 121 comprising of a plurality of circuits included in the controller 120 according to an embodiment of this disclosure is described below.

The page buffer controller 121 includes a second high voltage generator HV and first to $k^{th}$ PB voltage dividers PB_DIV1 to PB_DIVk. A high voltage generated from the second high voltage generator HV is transferred to the first to $k^{th}$ PB voltage dividers PB_DIV1 to PB_DIVk. The first to $k^{th}$ PB voltage dividers PB_DIV1 to PB_DIVk output the received high voltage in the form of respective signals for operating the switches N101 to N117 of the page buffer PB1 in response to the first to $k^{th}$ control signals PBCON1 to PBCONk generated from the controller 120.

For example, the first PB voltage divider PB_DIV1 may output the high voltage, received from the second high voltage generator HV, in the form of the even precharge signal DISCHe, which may be used to turn on the first switch N101 of the page buffer PB1 in response to the first control signal PBCON1. Similarly, the second PB voltage divider PB_DIV2 outputs the high voltage, received from the second high voltage generator HV, in the form of the odd precharge signal DISCHo, which may be used to turn on the second switch N103 of the page buffer PB1 in response to the second control signal PBCON2.

Specially, fifth PB voltage divider PB_DIV5 divides the high voltage received from the second high voltage generator HV and outputs a divided voltage as a reference voltage Vref in response to the fifth control signal PBCON5. A secondary PB voltage divider PB_DIV5_2 divides the reference voltage Vref and outputs a divided voltage in the form of the second coupling signal PBSENSE for operating the switching element N109 of the page buffer PB1.

If program data such as data '0' stored in the latch circuits LC1 to LC3 is loaded and a bit line is discharged in a program operation, the controller 120 may output the fifth control signal PBCON5.

Generally, the page buffer controller 121 receives the high voltage from the second high voltage generator HV through the first to $k^{th}$ PB voltage dividers PB_DIV1 to PB_DIVk and transfers the high voltage to the switches of the page buffer PB1.

Accordingly, the page buffer controller 121 may include the same number of voltage dividers PB_DIV1 to PB_DIVk as there are switches included in the page buffer PB1. Signals outputs from the respective PB voltage dividers PB_DIV1 to PB_DIVk are collectively called the page buffer control signal PB_SIGNALS.

A method of operating the semiconductor memory device constructed as above is described below.

Figure 4:
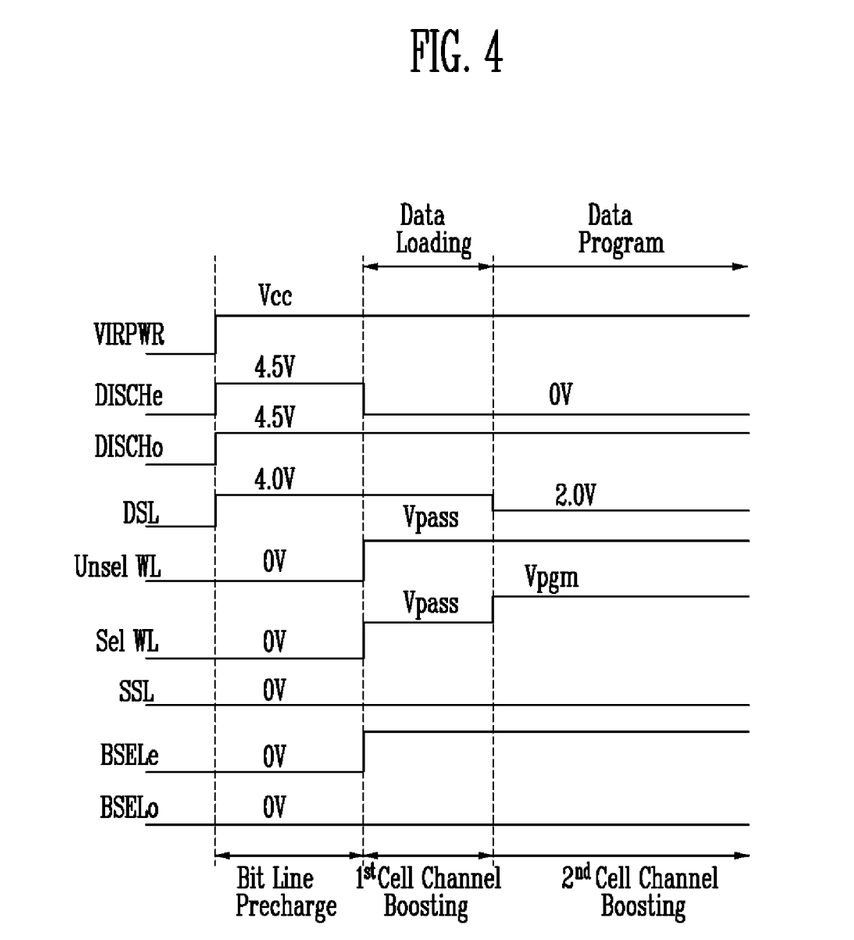
FIG. 4 shows waveforms of signals to illustrate a method of operating the semiconductor memory device according to a first embodiment of this disclosure.

FIG. 4 shows waveforms of signals for illustrating a method of operating the semiconductor memory device according to a first embodiment of this disclosure.

Referring to FIG. 4, in the method of operating the semiconductor memory device according to the first embodiment of this disclosure, the even and the odd bit lines are precharged. For this to occur, high discharge signals DISCHe and DISCHo are supplied so that a power source voltage Vcc is transferred to the even and the odd bit lines via VIRPWR. At this time, a first voltage 4 V is supplied to the drain select line DSL so that the drain select transistor DST is turned on. Consequently, since the even and the odd bit lines and the cell string are coupled, the channel of the even and the odd cell strings are also precharged.

Next, the pass voltage Vpass is supplied both to a selected word line Sel WL to which a memory cell to be programmed is coupled, and to the remaining unselected word lines Unsel WL, hence including all word lines. Subsequently, data to be programmed into the memory cell is loaded. A method of programming the data into the memory cell is performed using FN tunneling. This method may be used to program data '0'. In contrast, since an operation of programming data '1' is a process of continuing to maintain the previous state of a memory cell, FN tunneling should not be utilized. This is achieved with a cell channel boosting method. If data '0' is to be programmed, the voltage of a bit line is discharged, and thus the channel of a cell string including a memory cell to be programmed is also discharged. A bit line coupled to a cell string on which either the operation of programming data '1' is performed or a program operation is not performed, must maintain the power source voltage level Vcc. Channel boosting is primarily generated in the bit line because voltages of all the word lines rise to the level of pass voltage Vpass.

Next, when the program voltage Vpgm is supplied to the selected word line Sel WL, FN tunneling is generated in memory cells into which data '0' will be programmed, and thus a program operation is performed on the memory cells. However, secondary channel boosting is generated in memory cells on which the program operation is not performed due to the program voltage Vpgm. Thus, FN tunneling is not generated in the memory cells on which the program operation is not performed.

The operation of programming data '0' is described below. First, after the channel of a memory cell is discharged, the program voltage Vpgm is supplied to the selected word line Sel WL. Thus, a severe FN tunneling operation is generated owing to a high voltage difference between the channel of the memory cell and the control gate immediately after the program voltage Vpgm is supplied to the selected word line Sel WL. Furthermore, this condition is likewise applied to a fast cell having a fast program speed, i.e. a cell having a threshold voltage rapidly rising when the program voltage Vpgm is supplied, or a slow cell having a slow program speed, i.e. a cell having a threshold voltage slowly rising when the program voltage Vpgm is supplied. For this reason, in the present embodiment, there is a possibility that an excessive change of the threshold voltage exceeding a normal range may be generated in the fast cell.

In order to reduce this possibility, if a program operation is sought to be performed on memory cells slowly and finely, FN tunneling must be slowly generated. It is then necessary to slowly raise the voltage difference between the channel of a memory cell and the control gate.

A method of slowly changing a voltage difference between the channel of a memory cell and a control gate may include a method of discharging a channel and slowly changing a word line voltage thereafter, and a method of setting a word line voltage as the program voltage Vpgm and slowly discharging a channel thereafter.

A method of slowly raising a voltage difference between the channel of a memory cell and the control gate is described below.

Figure 5:
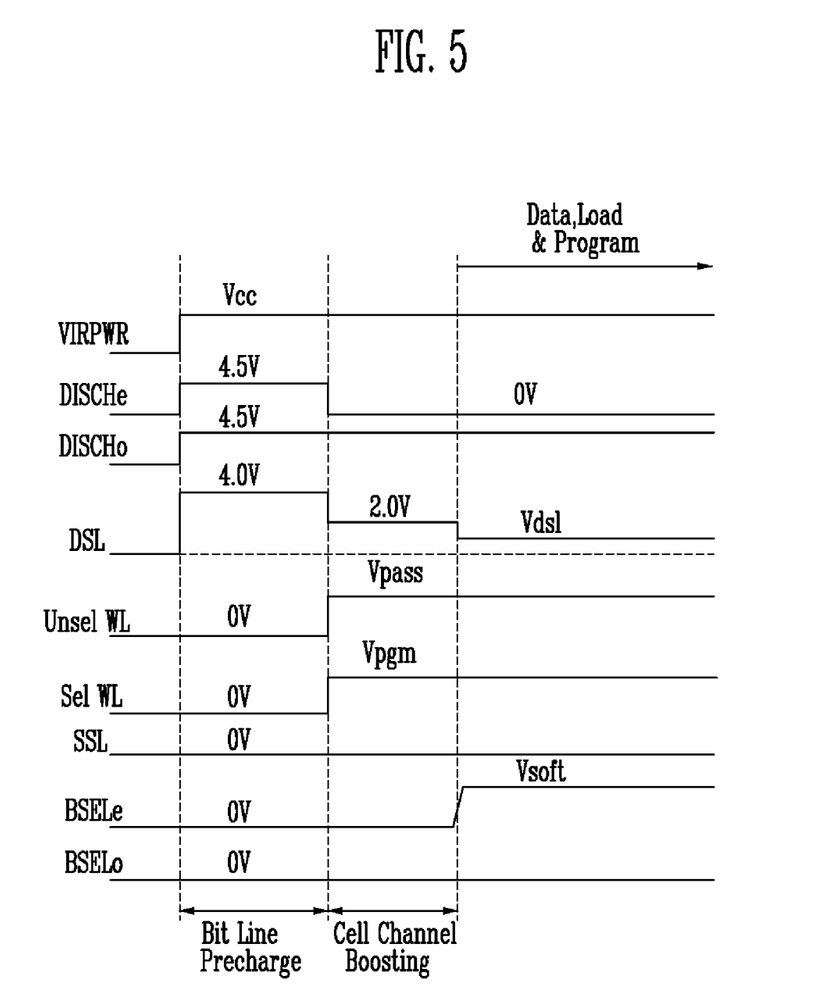
FIG. 5 shows waveforms of signals to illustrate a method of operating the semiconductor memory device according to a second embodiment of this disclosure.
Figure 6:
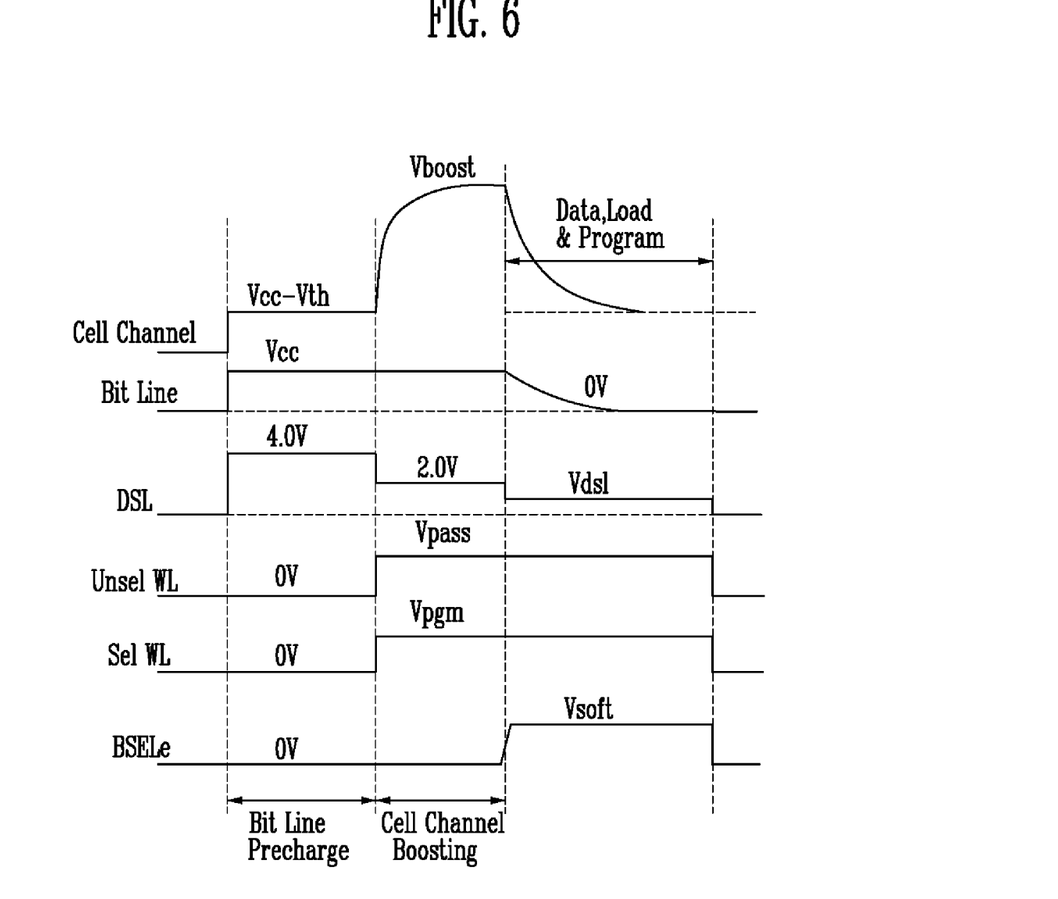
FIG. 6 shows waveforms of signals to illustrate a change in the voltage of a bit line and a cell channel in response to the waveforms of FIG. 5.

FIG. 5 shows waveforms of signals for illustrating a method of operating the semiconductor memory device according to a second embodiment of this disclosure, and FIG. 6 shows waveforms of signals for illustrating a change in the voltage of a bit line and a cell channel with respect to the waveforms of FIG. 5.

Referring to FIG. 5, in the method of operating the semiconductor memory device according to the second embodiment of this disclosure, as in the first embodiment of this disclosure, a bit line is precharged, and a first voltage 4 V is supplied to the drain select line DSL so that a relevant channel is precharged to the power source voltage level Vcc. When the first voltage is supplied to the drain select line DSL, the drain select transistor DST is turned on, and thus the bit line and a cell string coupled to the bit line are coupled. Thus, the channel may be precharged to the voltage of the bit line.

Next, a channel self-boosting operation is performed by providing a second voltage 2 V, which is lower than the first voltage 4 V, to the drain select line DSL, providing the program voltage Vpgm to a selected word line Sel WL, and providing the pass voltage Vpass to remaining unselected word lines Unsel WL. Via the channel self-boosting operation, a channel voltage rises up to a boosting voltage level. As described above, while the program voltage Vpgm is supplied to the selected word line Sel WL and the pass voltage Vpass is supplied to the remaining unselected word lines Unsel WL, voltage supplied to the drain select line DSL drops to the second voltage, 2 V lower than the first voltage example of 4 V. Thus, channel self-boosting can be surely generated because the drain select transistor DST is turned off.

The program voltage Vpgm and the pass voltage Vpass may also be supplied at the same time. In some embodiments, after the pass voltage Vpass is supplied to both the selected word line Sel WL and the remaining unselected word lines Unsel WL, the program voltage Vpgm may be supplied to the selected word line Sel WL when the voltage of the selected word line Sel WL reaches the pass voltage Vpass.

Subsequently, a program operation is performed on a memory cell while loading data to be programmed into the memory cell. First, data stored in the latch circuit of the page buffer PB1 is loaded by providing a voltage Vsoft bias to the switching element N105 for selecting the even bit line BLe. If an operation of programming data '0' is performed, the bit line BLe is discharged. In this case, the voltage of the bit line BLe may slowly discharge by controlling the voltage Vsoft bias supplied to the switching element N105 for selecting the even bit line BLe. Preferably, the bit line BLe may slowly discharge as compared with that of the first embodiment by providing a voltage lower than the reference voltage Vref supplied in the first embodiment.

In the present embodiment, an example in which the voltage Vsoft bias is supplied to the switching element N105 for selecting the bit line BLe has been described. However, the same effect may be obtained by providing a lower voltage Vsoft bias compared to the reference voltage Vref to the switching element N109 for detecting the bit line BLe as described with reference to FIG. 3.

If a bit line and a cell string are coupled and a channel is discharged, when a channel boosting operation is performed on the drain select line DSL, the channel may slowly discharge by providing a third voltage Vdsl that is lower than the second voltage of 2 V for example, to the drain select line DSL. Since the drain select transistor DST must be turned on, the third voltage Vdsl may be higher than the threshold voltage of the drain select transistor DST, but lower than the second voltage of 2 V. The third voltage Vdsl may be defined more accurately according to experiments, but preferably may be 1 to 1.5 V. Since the channel is discharged by providing a third voltage Vdsl that is lower than the second voltage of 2 V to the drain select line DSL when the channel boosting operation is performed as described above, the channel of the cell string on which the program operation of data '0' is performed may slowly discharge.

Referring to FIG. 6, as described above in the channel boosting step, the voltage of the channel reaches a boosting voltage Vboost close to the pass voltage Vpass while the channel is self-boosted. Next, data stored in the latch circuit is loaded onto a memory cell that gets programmed in through a bit line. If data '0' is transferred, the voltage Vsoft supplied to a switching element for selecting the bit line is lower than that in the first embodiment. Thus, the voltage of the bit line is slowly discharged by the voltage Vsoft. Voltage supplied to the drain select line DSL drops from the second voltage 2 V to the third voltage Vdsl, and thus the channel is slowly discharged from the boosting voltage Vboost to 0 V. Since a voltage difference between the cell channel and the control gate is slowly increased, FN tunneling is slowly generated, with the result that the program speed is controlled.

The speed that FN tunneling is performed may be controlled by controlling the voltage Vsoft supplied to the switching element N105 or N109 for coupling the bit line BLe and the latch circuit of the page buffer PB1 for storing program data, the third voltage Vdsl supplied to the drain select line DSL in order to couple the bit line BLe and the cell string, and the time that the voltages are taken to be supplied. Thus, the speed that data is programmed into a memory cell can be controlled.

A bit line coupled to a program-inhibited cell string on which an operation of programming data '1' is performed or a program operation is not performed continues to maintain the power source voltage Vcc. Thus, the channel maintains the boosting voltage Vboost, FN tunneling is not generated, and the program operation is not performed on the bit line.

In accordance with the present disclosure, as described above, a soft program operation can be performed by simply controlling the speed that a channel is discharged during a program operation without using additional circuits in a page buffer and additional algorithm. In other words, a program operation can be slowly performed. Thus, there is an advantage in that a semiconductor memory device can be easily implemented and optimized with soft program operation.

A soft program operation may be performed in such a manner that, in the state in which the channel of memory cells is floated, the channel of the memory cells is self-boosted by providing a high voltage to a control gate and the FN tunneling speed of memory cells into which data '0' is programmed (0 V supplied to a bit line) is controlled by controlling the time that the cell channel is discharged.

A soft program method capable of finely performing a program operation by using a simple algorithm even without adding a new circuit to a page buffer can be implemented, allowing for improvement in memory cell distribution.

What is claimed is:

1. A method of operating the semiconductor memory device, comprising:
    precharging a bit line;
    providing a first voltage to a drain select transistor for coupling the bit line and a cell string to precharge a channel of the cell string;
    providing a program voltage to a selected word line coupled to a memory cell on which a program operation is to be performed among the plurality of memory cells;
    providing a pass voltage to unselected word lines;
    providing a second voltage lower than the first voltage to the drain select transistor to increase a voltage of the channel;
    discharging the bit line by loading program data; and
    providing a third voltage lower than the second voltage to the drain select transistor to slowly discharge the channel.

2. The method of claim 1, wherein providing the program voltage to the selected word line and providing the pass voltage to the unselected word lines includes simultaneously providing the program voltage and the pass voltage.

3. The method of claim 1, wherein providing the program voltage to the selected word line and providing the pass voltage to the unselected word lines includes simultaneously providing the pass voltage to the selected word line and the unselected word lines and then providing the program voltage to the selected word line once the voltage of the selected word line reaches the pass voltage.

4. A method of operating the semiconductor memory device, comprising:
    precharging a bit line coupled to cell strings of a plurality of memory cells;
    providing a program voltage to a selected word line coupled to a memory cell on which a program operation will be performed among the plurality of memory cells;
    providing a pass voltage to the remaining unselected word lines; and
    discharging the bit line by loading program data stored in a latch circuit,
    wherein discharging the bit line includes providing voltage lower than a reference voltage to a coupling circuit in a page buffer for coupling the latch circuit and the bit line, and wherein the reference voltage is lower than VDD.

5. The method of claim 4, wherein providing the program voltage to the selected word line and providing the pass voltage to the unselected word lines occurs simultaneously.

6. The method of claim 4, wherein providing the program voltage to the selected word line and providing the pass voltage to the unselected word lines includes simultaneously providing the pass voltage to the selected word line and the unselected word lines and then providing the program voltage to the selected word line once voltage of the selected word line reaches the pass voltage.

7. A method of operating the semiconductor memory device, comprising:
  precharging a bit line;
  providing a first voltage to a drain select transistor for coupling the bit lines and cell strings of a plurality of memory cells;
  providing a program voltage to a selected word line coupled to a memory cell on which a program operation will be performed among the plurality of memory cells;
  providing a pass voltage to unselected word lines;
  providing a second voltage lower than the first voltage to the drain select transistor; and
  discharging the bit line by loading program data stored in a latch circuit,
  wherein discharging the bit line includes providing voltage lower than a reference voltage to a coupling circuit for coupling the latch circuit and the bit line, and providing a third voltage lower than the second voltage to the drain select transistor, and
  wherein the reference voltage is lower than VDD.

8. The method of claim 7, wherein providing the program voltage to the selected word line and providing the pass voltage to the unselected word lines occurs simultaneously.

9. The method of claim 7, wherein providing the program voltage to the selected word line and providing the pass voltage to the unselected word lines includes simultaneously providing the pass voltage to the selected word line and the unselected word lines and then providing the program voltage to the selected word line once voltage of the selected word line reaches the pass voltage.

10. A semiconductor memory device, comprising:
  cell strings each configured to include a source select transistor, a plurality of memory cells and a drain select transistor, wherein the drain select transistor is coupled between the memory cells and a bit line;
  page buffers each configured to include latch circuits for latching data and a coupling circuit for coupling the latch circuits and the bit line;
  a voltage supply circuit configured to sequentially supply a first voltage, a second voltage lower than the first voltage and a third voltage lower than the second voltage to the drain select transistor in response to first to third control signals, respectively, in a program operation, wherein the third voltage is greater than a ground voltage; and
  a controller configured to generate the first to third control signals and to supply voltage lower than a reference voltage to the coupling circuit when the bit line is discharged by loading program data stored in the latch circuits during the program operation,
  wherein the reference voltage is lower than VDD.

11. The semiconductor memory device of claim 10, wherein the voltage supply circuit comprises:
  a first voltage supply unit configured to supply the first voltage to the drain select transistor in response to the first control signal;
  a second voltage supply unit configured to supply the second voltage lower than the first voltage to the drain select transistor in response to the second control signal; and
  a third voltage supply unit configured to supply the third voltage lower than the second voltage to the drain select transistor in response to the third control signal.

12. The semiconductor memory device of claim 10, wherein within the program operation, the controller is configured to generate the first control signal when the bit line is precharged, generate the second control signal when a program voltage is supplied to a selected word line coupled to a memory cell on which the program operation will be performed and a pass voltage is supplied to unselected word lines, and generate the third control signal when the bit line is discharged.

13. The semiconductor memory device of claim 10, wherein the controller comprises:
  a first voltage divider configured to generate the reference voltage using a high voltage in response to a page buffer control signal; and
  a second voltage divider configured to receive the reference voltage and to generate voltage lower than the reference voltage.

14. The semiconductor memory device of claim 10, wherein the page buffer further comprises switching elements for precharging the bit line in the program operation.

15. The semiconductor memory device of claim 10, wherein each of the latch circuits comprises:
  a latch configured to latch the data;
  a first switching element operated based on a potential of a sense node between the latch circuit and the coupling circuit and coupled to a ground terminal;
  a second switching element coupled between a non-inverting terminal of the latch and the first switching element and operated in response to a reset signal;
  a third switching element coupled between an inverting terminal of the latch and the first switching element and operated in response to a set signal; and
  a fourth switching element coupled between the non-inverting terminal of the latch and the sense node and operated in response to a transfer signal.

16. A semiconductor memory device, comprising:
  cell strings each configured to include a source select transistor, a plurality of memory cells and a drain select transistor, wherein the drain select transistor is coupled between the memory cells and a bit line;
  a voltage supply circuit configured to supply a first voltage to the drain select transistor in response to a first control signal, supply a second voltage lower than the first voltage to the drain select transistor in response to a second control signal, and supply a third voltage lower than the second voltage to the drain select transistor in response to a third control signal in a program operation; and
  a controller configured to generate the first control signal when the bit line is precharged, generate the second control signal when a program voltage is supplied to a selected word line coupled to a memory cell on which the program operation will be performed and a pass voltage is supplied to unselected word lines, and generate the third control signal when the bit line is discharged in the program operation.

17. A semiconductor memory device, comprising:
  cell strings each configured to include a source select transistor, a plurality of memory cells and a drain select transistor, wherein the drain select transistor is coupled between the memory cells and a bit line;
  page buffers each configured to include latch circuits for latching data and a coupling circuit for coupling the latch circuits and the bit line; and
  a controller configured to supply voltage lower than a reference voltage to the coupling circuit when discharging the bit line by loading program data stored in the latch circuits in order to program the program data into the memory cells,
  wherein the reference voltage is lower than VDD.

18. The semiconductor memory device of claim 17, wherein the page buffer further comprises switching elements for precharging the bit line in a program operation.

19. The semiconductor memory device of claim 17, wherein each of the latch circuits comprises:
- a latch configured to latch the data;
- a first switching element operated based on a potential of a sense node between the latch circuit and the coupling circuit and coupled to a ground terminal;
- a second switching element coupled between a non-inverting terminal of the latch and the first switching element and operated in response to a reset signal;
- a third switching element coupled between an inverting terminal of the latch and the first switching element and operated in response to a set signal; and
- a fourth switching element coupled between the non-inverting terminal of the latch and the sense node and operated in response to a transfer signal.

* * * * *